(12) United States Patent
Fleming (10) Patent No.: US 10,876,201 B2
(45) Date of Patent: *Dec. 29, 2020

(54) BROADBAND FLUORESCENCE AMPLIFICATION ASSEMBLY

(71) Applicant: CAPE NANO PRODUCTS LLC, San Diego, CA (US)

(72) Inventor: Christopher J. Fleming, Vista, CA (US)

(73) Assignee: IRONWOOD 12 LLC, Park City, UT (US)

( * ) Notice: Subject to any disclaimer, the term of this patent is extended or adjusted under 35 U.S.C. 154(b) by 177 days.

This patent is subject to a terminal disclaimer.

(21) Appl. No.: 15/695,870

(22) Filed: Sep. 5, 2017

(65) Prior Publication Data

US 2018/0023184 A1    Jan. 25, 2018

Related U.S. Application Data

(63) Continuation-in-part of application No. 15/621,868, filed on Jun. 13, 2017.

(Continued)

(51) Int. Cl.
*C23C 14/18* (2006.01)
*C23C 14/24* (2006.01)
(Continued)

(52) U.S. Cl.
CPC ............ *C23C 14/18* (2013.01); *B01J 19/081* (2013.01); *B82Y 30/00* (2013.01); *C01B 32/168* (2017.08);
(Continued)

(58) Field of Classification Search
CPC ......... C23C 14/18; C23C 14/02; C23C 14/24; C23C 1/02; C01B 32/168; C01B 2202/08;
(Continued)

(56) References Cited

U.S. PATENT DOCUMENTS 7,060,390 B2 *  6/2006  Chen ................... C01G 53/42
429/231.8
7,086,451 B2    8/2006  Leu et al.
(Continued)

FOREIGN PATENT DOCUMENTS

CN    101794753 A    8/2010
CN    101794753 B    7/2011

OTHER PUBLICATIONS

Fan et al. ("Enhancement of field emission properties of cyanoacrylate-carbon nanotube arrays by laser treatment" Nanotechnology, 2004, 15, 1033-1037) (Year: 2004).*

(Continued)

*Primary Examiner* — Travis M Figg
(74) *Attorney, Agent, or Firm* — Roeder & Broder LLP; James P. Broder (57) ABSTRACT

A method for manufacturing a broadband fluorescence amplification assembly comprising the steps of providing a vertically aligned carbon nanotube ("VACNT") substrate that has been treated with a plasma and at least partially coated with a metal coating and a support structure, and supporting the VACNT substrate by the support structure. The support structure can include one of quartz or glass. The method can also include the steps of cleaning the support structure with an alcohol solution and/or exposing the support structure to one of a surface cleaning plasma or ozone. The method can further comprise the step of adhering the VACNT substrate to the support structure, wherein the step of adhering can include applying an adhesive material to at least a portion of the support structure. Additionally, the method can include the step of treating the VACNT substrate and the support structure with the plasma.

20 Claims, 8 Drawing Sheets

Related U.S. Application Data (60) Provisional application No. 62/355,243, filed on Jun. 27, 2016.

(51) Int. Cl.

| | |
|---|---|
| *C23C 14/02* | (2006.01) |
| *B01J 19/08* | (2006.01) |
| *C01B 32/168* | (2017.01) |
| *B82Y 30/00* | (2011.01) |
| *B82Y 20/00* | (2011.01) |
| *B82Y 40/00* | (2011.01) |

(52) U.S. Cl.
CPC .............. *C23C 14/02* (2013.01); *C23C 14/24* (2013.01); *B01J 2219/0879* (2013.01); *B01J 2219/0894* (2013.01); *B82Y 20/00* (2013.01); *B82Y 40/00* (2013.01); *C01B 2202/08* (2013.01); *Y10S 977/745* (2013.01); *Y10S 977/847* (2013.01); *Y10S 977/95* (2013.01)

(58) Field of Classification Search
CPC . B01J 19/081; B01J 2219/0894; B82Y 30/00; B82Y 10/00; B82Y 40/00; Y10S 977/745; Y10S 977/847; Y10S 977/95
See application file for complete search history.

(56) References Cited

U.S. PATENT DOCUMENTS

| | | | |
|---|---|---|---|
| 7,109,581 B2 | 9/2006 | Dangelo et al. | |
| 7,316,061 B2 | 1/2008 | Dubin et al. | |
| 7,811,542 B1 | 10/2010 | McElrath et al. | |
| 8,309,051 B2 | 11/2012 | Yao et al. | |
| 8,702,897 B2 | 4/2014 | Lin et al. | |
| 9,067,791 B2* | 6/2015 | Kim | B82Y 30/00 |
| 9,861,710 B1 | 1/2018 | Ruckh et al. | |
| 2005/0230270 A1* | 10/2005 | Ren | C01B 32/162 |
| | | | 205/777.5 |
| 2006/0172179 A1* | 8/2006 | Gu | H01M 4/8892 |
| | | | 429/482 |
| 2007/0158584 A1 | 7/2007 | Lin | |
| 2007/0193143 A1* | 8/2007 | Antonic | E04H 9/14 |
| | | | 52/241 |
| 2007/0257766 A1 | 11/2007 | Richards et al. | |
| 2008/0019485 A1 | 1/2008 | Weiss et al. | |
| 2008/0131722 A1 | 6/2008 | Suhir | |
| 2008/0317660 A1* | 12/2008 | Pan | B82Y 10/00 |
| | | | 423/447.2 |
| 2009/0195989 A1 | 8/2009 | Oda | |
| 2010/0021736 A1 | 1/2010 | Slinker | |
| 2010/0127269 A1 | 5/2010 | Daniel et al. | |
| 2010/0313951 A1* | 12/2010 | Nalamasu | B82Y 10/00 |
| | | | 136/256 |
| 2011/0163296 A1* | 7/2011 | Pace | B82Y 15/00 |
| | | | 257/24 |
| 2011/0177493 A1* | 7/2011 | Lu | B01J 23/75 |
| | | | 435/5 |
| 2011/0189500 A1* | 8/2011 | Majumdar | H01L 23/373 |
| | | | 428/623 |
| 2012/0085526 A1 | 4/2012 | Yeh | |
| 2012/0321961 A1* | 12/2012 | Yushin | H01M 4/133 |
| | | | 429/231.8 |
| 2013/0256868 A1* | 10/2013 | Aliyev | H01L 23/34 |
| | | | 257/713 |
| 2013/0342965 A1* | 12/2013 | Fujita | C01B 32/168 |
| | | | 361/503 |
| 2014/0015158 A1* | 1/2014 | Cola | B01J 35/0006 |
| | | | 264/81 |
| 2015/0146865 A1* | 5/2015 | Kim | H01J 1/34 |
| | | | 378/122 |
| 2016/0006039 A1 | 1/2016 | Cosnier et al. | |
| 2016/0052094 A1* | 2/2016 | Fleming | C23C 14/22 |
| | | | 165/185 |
| 2016/0200577 A1* | 7/2016 | Cornwell | C01B 32/168 |
| | | | 423/447.2 |
| 2017/0131287 A1 | 5/2017 | McNicholas et al. | |

OTHER PUBLICATIONS

Tanaka et al. ("High-Yield Separation of Metallic and Semiconducting Single-Wall Carbon Nanotubes by Agarose Gel Electrophoresis" Applied Physics Express 1 (2008) 114001) (Year: 2008).*

Ji et al. ("Wettability Control of VACNT Array through Atmospheric Plasma Treatment" Journal of Heat Transfer Feb. 2015, 137 pg. 020903-1) (Year: 2015).*

By Lauren ("Why is Contact angle important" Biolin Scientific https://www.biolinscientific.com/blog/why-is-contact-angle-important) (Year: 2018).*

Office Action dated Jun. 1, 2017 in U.S. Appl. No. 14/818,867, filed Aug. 5, 2015 by Fleming et al., with its entire prosecution and file history.

* cited by examiner

BROADBAND FLUORESCENCE AMPLIFICATION ASSEMBLY

RELATED APPLICATIONS

The present application is a continuation-in-part application and claims the benefit under 35 U.S.C. 120 on pending U.S. patent application Ser. No. 15/621,868, filed on Jun. 13, 2017 and entitled "VERTICALLY-ALIGNED CARBON NANOTUBE SUBSTRATE HAVING INCREASED SURFACE AREA", which claims the benefit on U.S. Provisional Patent Application Ser. No. 62/355,243, filed Jun. 27, 2016, and entitled "THREE-DIMENSIONAL HIERARCHICALLY-STRUCTURED VERTICALLY-ALIGNED CARBON NANOTUBE SUBSTRATES FOR FLUORESCENCE-BASED ASSAYS". To the extent permitted, the contents of U.S. patent application Ser. No. 15/621,868 and U.S. Provisional Patent Application Ser. No. 62/355,243 are incorporated herein by reference.

BACKGROUND

The current technology for fluorescent detection of secondary or tertiary adsorption is reaching its limits for one simple reason: fluorescent domains of ever-decreasing size fluoresce proportionally to their footprint area (for any given fluorophore). The two-dimensional confinement limits fluorescence intensity by lessening the available fluorophore area, thus reducing the number of photons emitted as the domain size is reduced.

SUMMARY

The present invention is directed toward a broadband fluorescence amplification assembly. In various embodiments, the broadband fluorescence amplification assembly includes a vertically aligned carbon nanotube substrate and a support structure. In certain embodiments, the vertically aligned carbon nanotube substrate has been treated with a plasma. Further, the vertically aligned carbon nanotube substrate can be at least partially coated with a metal coating. The support structure supports the vertically aligned carbon nanotube substrate. In some embodiments, the support structure can include one of quartz or glass. In certain embodiments, the support structure can be cleaned with an alcohol solution, such as an ethanol. Further, in other embodiments, the support structure can be exposed to one of a surface cleaning plasma or ozone.

In certain embodiments, the broadband fluorescence amplification assembly can also include an adhesive material that is applied to at least a portion of the support structure. In such embodiments, the adhesive material can adhere the vertically aligned carbon nanotube substrate to the support structure. In some embodiments, the adhesive material can include one of a cyanoacrylate adhesive. In another non-exclusive embodiment, the adhesive material can include a two component epoxy.

In various embodiments, the vertically aligned carbon nanotube substrate and the support structure can be treated with the plasma.

In some embodiments, the support structure can include a substantially flat adhering surface. In such embodiments, the adhesive material can be applied to at least a portion of the substantially flat adhering surface such that the adhesive material adheres the vertically aligned carbon nanotube substrate to the support structure.

The present invention is also directed toward a method for manufacturing a broadband fluorescence amplification assembly. In certain embodiments, the method includes the steps of providing a vertically aligned carbon nanotube substrate that has been treated with a plasma and at least partially coated with a metal coating and a support structure, and supporting the vertically aligned carbon nanotube substrate by the support structure. In such embodiments, the vertically aligned carbon nanotube substrate can be positioned on the support structure.

In some embodiments, the support structure can include one of quartz or glass.

In certain embodiments, the method can also include the step of cleaning the support structure with an alcohol solution. In other embodiments, the method can also include the step of exposing the support structure to one of a surface cleaning plasma or ozone.

Further, in certain embodiments, the method can also comprise the step of adhering the vertically aligned carbon nanotube substrate to the support structure. In various embodiments, the step of adhering can include applying an adhesive material to at least a portion of the support structure.

Additionally, the method can include the step of treating the vertically aligned carbon nanotube substrate and the support structure with the plasma.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Embodiments of the present invention are described herein in the context of a broadband fluorescence amplification assembly and a method for manufacturing the broadband fluorescence amplification assembly. Those of ordinary skill in the art will realize that the following detailed description of the present invention is illustrative only and is not intended to be in any way limiting. Other embodiments of the present invention will readily suggest themselves to such skilled persons having the benefit of this disclosure.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As an overview, the vertically aligned carbon nanotube (also sometimes referred to herein as "VACNT") substrate described herein overcomes two-dimensional spatial confinement of primary, secondary, tertiary, etc. adsorbates. Additionally, or in the alternative, the VACNT substrate allows for collimated addition of fluorescence intensity leading to a substantial increase in signal-to-noise emission. Moreover, the VACNT substrate can provide further reduction of substrate surface areas.

Figure 1:
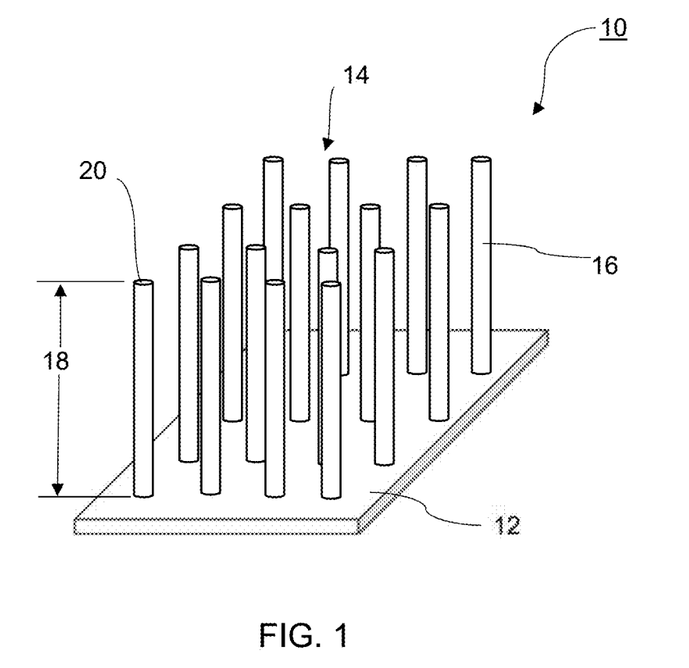
FIG. 1 is a simplified perspective view illustration of one embodiment of a portion of a vertically aligned carbon nanotube substrate having features of the present invention.

FIG. 1 is a simplified perspective view of one embodiment of a portion of the VACNT substrate 10. It is understood that, although not illustrated and/or described relative to FIG. 1, the VACNT substrate 10 can also include one or more of the structures or embodiments described in greater detail herein. The VACNT substrate 10 has a three-dimensional surface area. The size and shape of the VACNT substrate 10 can be varied. It is recognized that the simplified perspective view of the VACNT substrate 10 illustrated in FIG. 1 is for representative purposes only, and that any suitable VACNT substrate 10 can be used in accordance with the methods disclosed herein. In various embodiments, the VACNT substrate 10 can include a base 12 and a VACNT array 14.

The base 12 is the surface upon which the VACNT array 14 can grow. In this embodiment, the base 12 has a rectangular footprint. Alternatively, the base 12 can have any suitably shaped footprint. In various embodiments, depending on the shape of the footprint, the base 12 can also have a varying surface area. In one embodiment, the base 12 can be formed from a silicon (Si) wafer. Alternatively, the base 12 may be formed from any other suitable material.

The VACNT array 14 can be produced using a variety of methods and catalysts. The design of the VACNT array 14 can be varied. The VACNT array 14 can include a plurality of nanotubes 16. The nanotubes 16 can have extremely small diameters in the nanoscale. In the embodiment illustrated in FIG. 1, the VACNT array 14 has a relatively small number of nanotubes 16. It is recognized that a typical VACNT array 14 can have thousands, millions, billions or even trillions of nanotubes 16. In alternative embodiments, the VACNT array 14 can include any number of nanotubes 16. It is understood that for ease in understanding the portion of the VACNT array 14 illustrated in FIG. 1 is not shown to scale.

Further, the VACNT array 14 can include a varying density of nanotubes 16. Depending on the method and catalyst used to produce the VACNT array 14, several types of nanotubes 16 with numerous morphologies may result. In one embodiment, the VACNT array 14 can include nanotubes 16 with diameters of approximately 20 nanometers ("nm"). Alternatively, the nanotubes 16 can have a diameter greater than approximately 20 nm or less than approximately 20 nm. The nanotubes 16 can be fibrous or rough. In addition, the nanotubes 16 can grow or extend away from the base 12 in a direction that is substantially normal to the base 12. Alternatively, the nanotubes 16 can grow or extend away from the base 12 in a direction that is less than 90 degrees relative to the base 12.

Furthermore, each nanotube 16 has a nanotube height 18 and a nanotube tip 20. The nanotube height 18 is measured from a point of contact between the nanotube 16 and the base 12 and extending to the nanotube tip 20. The nanotube tip 20 can be located at or near the end point or tip of the nanotube 16. In alternative embodiments, the nanotube height 18 can be measured in any suitable manner known to those skilled in the art. In one non-exclusive embodiment, the nanotubes 16 can have the nanotube height 18 of approximately 1 millimeter ("mm"). In alternative embodiments, the nanotube height 18 can be varied, i.e., greater or less than approximately 1 mm.

In contrast to the VACNT substrate 10, a flat substrate (also sometimes referred to herein as a "conventional substrate") does not include the VACNT array 14. Generally, the conventional substrate only includes a base 12. As such, in certain embodiments, the VACNT substrate 10 shown and described herein can yield a significantly increased surface area when compared to the conventional substrate that has a similarly shaped footprint and/or base surface area. As one non-exclusive example, the VACNT substrate 10 can yield approximately a 77-fold increase when compared to the conventional substrate that has a similarly shaped footprint and/or base surface area. In other embodiments, the VACNT substrate 10 can yield an increase that is greater than approximately 77-fold and/or less than approximately 77-fold. This increased surface area provided by the VACNT substrate 10 over the conventional substrate can result in one or more of the following advantages: an increased fluorescence emission intensity, an increased signal to noise ratio and/or an allowable decrease in surface area of the footprint and/or base 12 of the VACNT substrate 10.

Figure 2A:
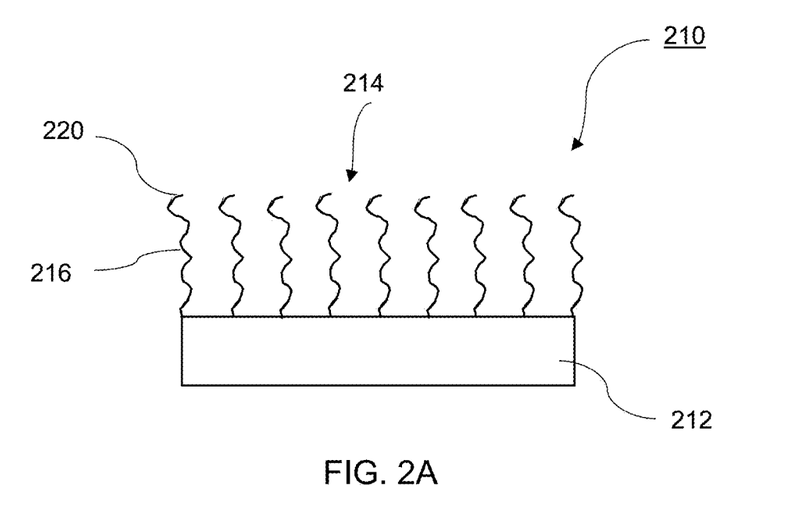
FIG. 2A is a simplified side view illustration of an embodiment of a portion of a vertically aligned carbon nanotube substrate shown in an untreated state.

FIG. 2A is a simplified side view illustration of an embodiment of a portion of a VACNT substrate 210 shown in an untreated state. The untreated state can include any state where the VACNT substrate 210 has not been treated with or exposed to a plasma 322 (illustrated in FIG. 3A). In various embodiments, the VACNT substrate 210 in the untreated state can include a VACNT array 214 in the untreated state and the base 212. In such embodiments, the VACNT array 214 in the untreated state is generally hydrophobic. Each VACNT array 214 in the untreated state includes a plurality of nanotubes 216 in the untreated state. The nanotubes 216 in the untreated state also include nanotube tips 220 in the untreated state. As shown in FIG. 2A, the nanotubes 216, and their tips 220, in the untreated state can be relatively disorganized and not consistently vertically aligned with one another.

Figure 2B:
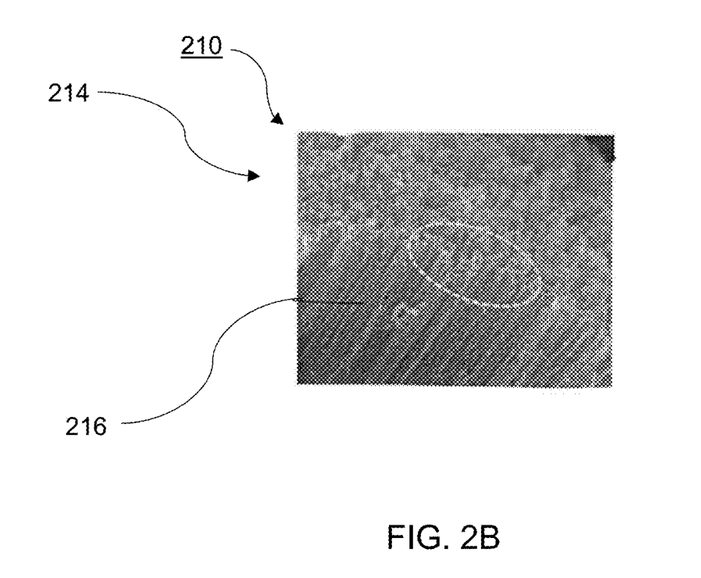
FIG. 2B is a perspective view of a scanning electron microscopy image of one embodiment of a portion of the vertically aligned carbon nanotube substrate shown in the untreated state.

FIG. 2B is a perspective view of a scanning electron microscopy image of one embodiment of a portion of the VACNT substrate 210 shown in the untreated state. The image in FIG. 2B shows the VACNT array 214, including the nanotubes 216 that make up the VACNT array 214, is relatively tangled, not consistently aligned, relatively disorganized and/or somewhat clustered while in the untreated state.

Figure 2C:
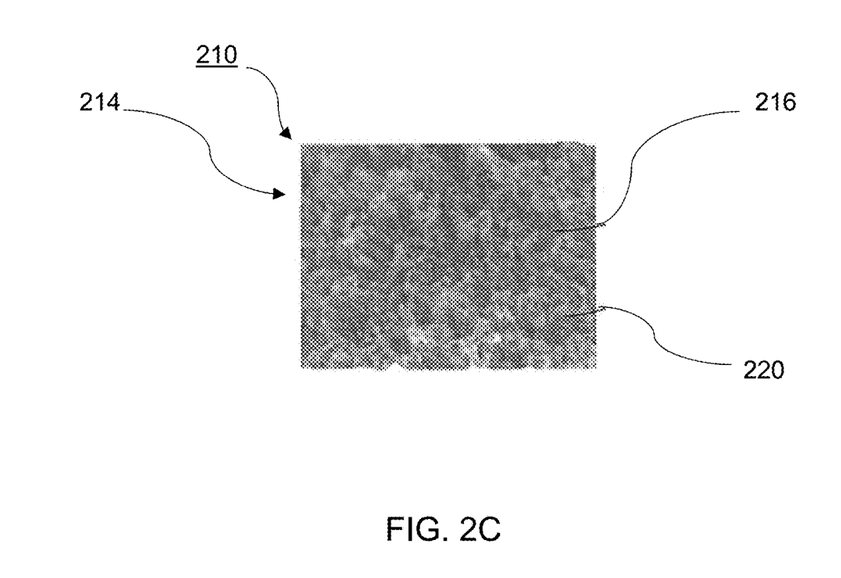
FIG. 2C is a close-up perspective view of the scanning electron microscopy image of a portion of the vertically aligned carbon nanotube substrate illustrated in a dashed oval in FIG. 2B.

FIG. 2C is a close-up perspective view of the scanning electron microscopy image of a portion of the VACNT substrate 210 illustrated in the dashed oval in FIG. 2B. The image in FIG. 2C also shows the VACNT array 214, including the nanotubes 216, while in the untreated state. The image in FIG. 2C more clearly shows the nanotube tips 220 in the untreated state are relatively tangled, not consistently aligned, relatively disorganized and/or somewhat clustered.

Figure 3A:
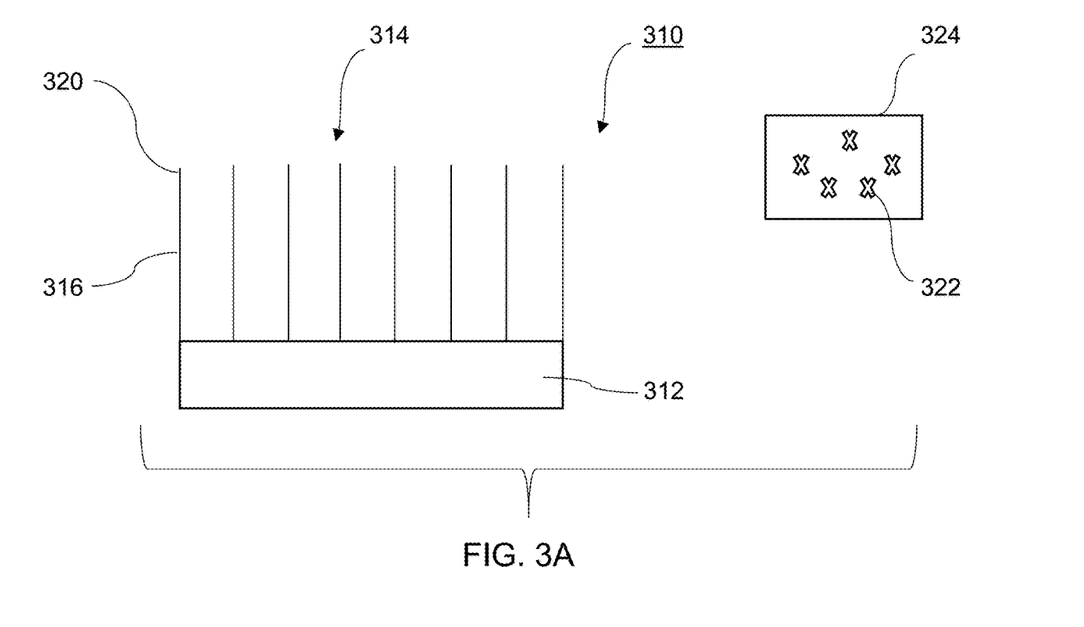
FIG. 3A is a simplified side view illustration of an embodiment of a plasma, a plasma chamber and a portion of a vertically aligned carbon nanotube substrate shown in a plasma-treated state.

FIG. 3A is a simplified side view illustration of an embodiment of a plasma 322, a plasma chamber 324 and a portion of a VACNT substrate 310 shown in a plasma-treated state. The plasma-treated state can include the state where at least a portion of the VACNT substrate 210 (illustrated in FIG. 2A, for example) in the untreated state has been treated with or exposed to the plasma 322. In accordance with the methods disclosed herein, in certain embodiments, at least a portion of the VACNT substrate 210 in the untreated state has been treated with or exposed to the plasma 322 to generate the VACNT substrate 310 in the plasma-treated state. In various embodiments, the VACNT substrate 210 in the untreated state can be treated with or exposed to the plasma 322 in the plasma chamber 324. Alternatively, the VACNT substrate 210 in the untreated state can be treated with or exposed to the plasma 322 in any suitable manner.

In one non-exclusive embodiment, the plasma 322 may include ammonia. In other embodiments, the plasma 322 can include any other suitable compound, combination or composition.

In various embodiments, the VACNT substrate 310 in the plasma-treated state can include a VACNT array 314 in the plasma-treated state and the base 312. Each VACNT array 314 in the plasma-treated state includes a plurality of nanotubes 316 in the plasma-treated state. In certain embodiments, the nanotubes 316 in the plasma-treated state have been at least partially treated with the plasma 322. The nanotubes 316 in the plasma-treated state also include nanotube tips 320 in the plasma-treated state. In certain embodiments, the nanotube tips 320 in the plasma-treated state have been at least partially treated with the plasma 322. In some such embodiments, after treatment, the VACNT array 314 in the plasma-treated state can gain hydrophilicity. Further, as a result of the plasma treatment, the nanotubes 316, and their tips 320, in the plasma-treated state become substantially less tangled, less clustered and better organized with increased consistency.

Figure 3B:
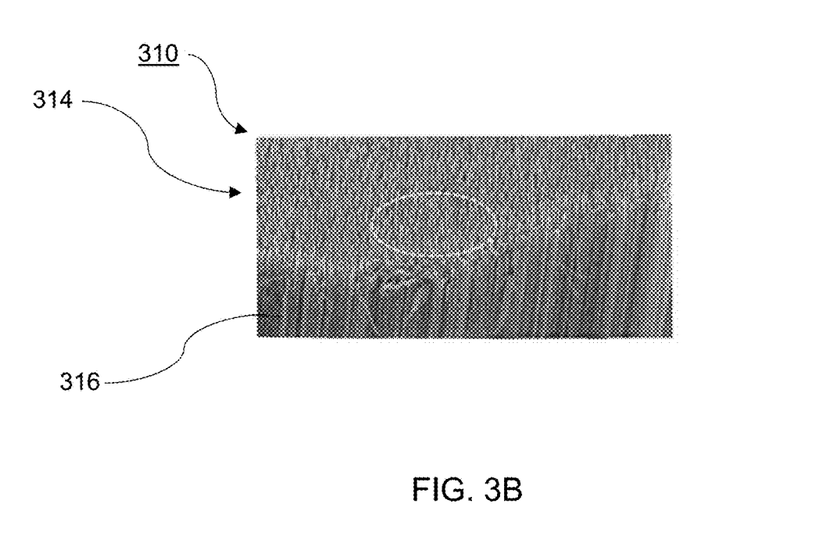
FIG. 3B is a perspective view of a scanning electron microscopy image of one embodiment of a portion of the vertically aligned carbon nanotube substrate shown in the plasma-treated state.

FIG. 3B is a perspective view of a scanning electron microscopy image of one embodiment of a portion of the VACNT substrate 310 shown in the plasma-treated state. The image of FIG. 3B shows the VACNT array 314, including the nanotubes 316 that make up the VACNT array 314, has become substantially straightened vertically and are better aligned with one another while in the plasma-treated state.

Figure 3C:
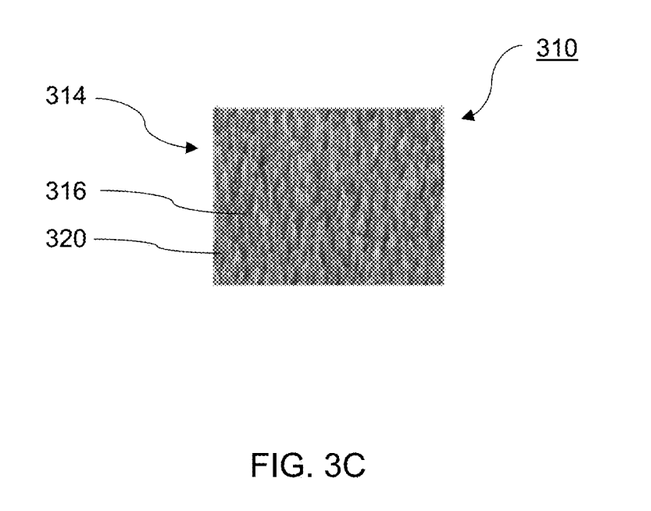
FIG. 3C is a close-up perspective view of the scanning electron microscopy image of a portion of the vertically aligned carbon nanotube substrate illustrated in a dashed oval in FIG. 3B.

FIG. 3C is a close-up perspective view of the scanning electron microscopy image of a portion of the VACNT substrate 310 illustrated in the dashed oval in FIG. 3B. The image in FIG. 3C also shows the VACNT array 314, including the nanotubes 316, while in the plasma-treated state. The image of FIG. 3C more clearly shows the nanotube tips 320 in the plasma-treated state have become substantially straightened vertically and aligned.

Figure 4:
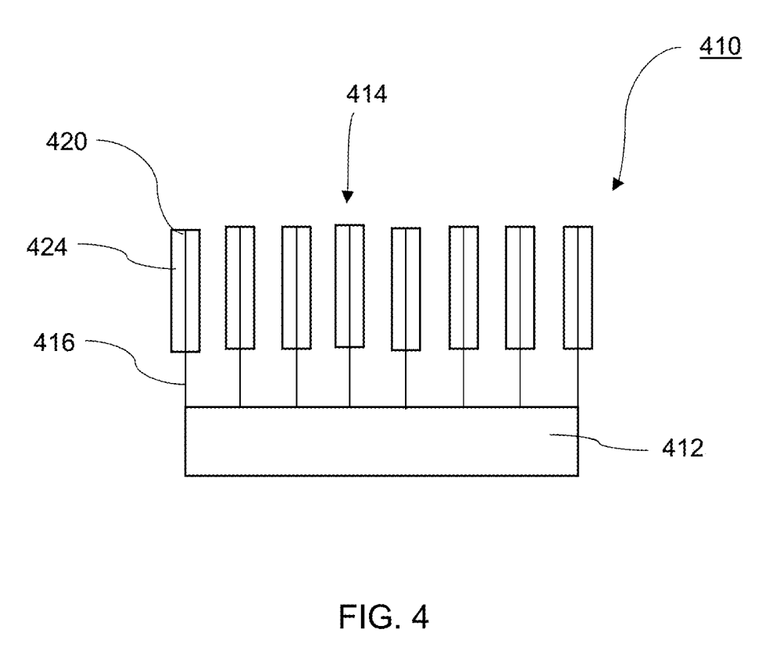
FIG. 4 is a simplified side view illustration of an embodiment of a portion of a vertically aligned carbon nanotube substrate shown in a coated state.

FIG. 4 is a simplified side view illustration of an embodiment of a portion of a VACNT substrate 410 shown in a coated state. The coated state can include the state where a coating 424 has been adhered to at least a portion of the VACNT substrate 310 (illustrated in FIG. 3A, for example) in the plasma-treated state. Additionally, the coated state can include the state where the coating 424 has been adhered to at least a portion of the VACNT substrate 210 in the untreated state. In the embodiment illustrated in FIG. 4, the coating 424 has been adhered to a portion of the VACNT array 314 (illustrated in FIG. 3A, for example) in the plasma-treated state. In various embodiments, the coating 424 can include any metallic or metal material, or metal alloys. In some embodiments, the metallic or metal material can include any suitable transition metal. In one non-exclusive embodiment, the metallic or metal material can include gold ("Au"). In other non-exclusive embodiments, the coating 424 can include any rare earth combination known to those skilled in the art. Additionally and/or alternatively, the coating 424 may also include silane or silica.

Further, in some embodiments, the coating 424 can be adhered to a portion of the VACNT array 314 in the plasma-treated state using a process of thermal evaporation and/or e-beam ablation. In other embodiments, the coating 424 can be adhered to a portion of the VACNT array 214 (illustrated in FIG. 2A, for example) in the untreated state. In alternative embodiments, the coating 424 can be adhered to a portion of the VACNT array 314 in the plasma-treated state or a portion of the VACNT array 214 in the untreated state using any suitable method or process.

In various embodiments, the VACNT substrate 410 in the coated state can include a VACNT array 414 in the coated state and the base 412. Each VACNT array 414 in the coated state can also include a plurality of nanotubes 416 in the coated state. In certain embodiments, the nanotubes 416 in the coated state have been at least partially coated with the coating 424. The nanotubes 416 in the coated state also include nanotube tips 420 in the coated state. In the embodiment illustrated in FIG. 4, the nanotubes 416, including the nanotube tips 420, have been at least partially, if not fully, coated with the coating 424.

Figure 5:
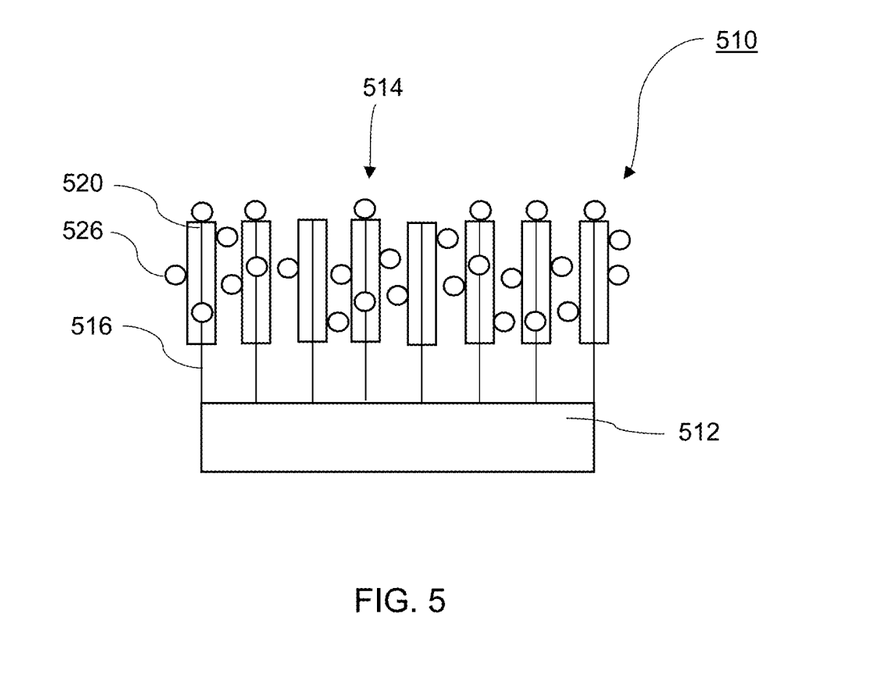
FIG. 5 is a simplified side view illustration of an embodiment of a portion of a vertically aligned carbon nanotube substrate shown in a fluorophore-exposed state.

FIG. 5 is a simplified side view illustration of an embodiment of a portion of a VACNT substrate 510 shown in a fluorophore-exposed state. The fluorophore-exposed state can include the state where a plurality of fluorophores 526 has been adhered to a portion of the VACNT substrate 410 (illustrated in FIG. 4) in the coated state. Additionally, the fluorophore-exposed state can include the state where the plurality of fluorophores 526 has been adhered to at least a portion of the VACNT substrate 310 (illustrated in FIG. 3A, for example) in the plasma-treated state or at least a portion of the VACNT substrate 210 (illustrated in FIG. 2A, for example) in the untreated state. In the embodiment illustrated in FIG. 4, the plurality of fluorophores 526 has been adhered to the VACNT array 414 (illustrated in FIG. 4) in the coated state. In various embodiments, any suitable type of fluorophore 526 can be used. In alternative embodiments, any molecule known to those skilled in the art can be used in place of the fluorophore 526. Further, any suitable method or process for adhering the plurality of fluorophores 526 to the VACNT array 414 in the coated state can be used.

In various embodiments, the VACNT substrate 510 in the fluorophore-exposed state can include a VACNT array 514 in the fluorophore-exposed state and the base 512. Each VACNT array 514 in the fluorophore-exposed state can also include nanotubes 516 in the fluorophore-exposed state. In certain embodiments, the fluorophores 526 can adhere at least partially to the nanotubes 516 in the fluorophore-exposed state. The nanotubes 516 in the fluorophore-exposed state also include nanotube tips 520 in the fluorophore-exposed state. In certain embodiments, at least some of the fluorophores 526 can adhere to the nanotube tips 520 (and/or other portions of the nanotubes 516) in the fluorophore-exposed state.

The VACNT substrate 510 in the fluorophore-exposed state can have an increased brightness level and brightness intensity when compared to the conventional substrate. In one non-exclusive example, the VACNT substrate 510 in the fluorophore-exposed state can yield the brightness level that is approximately 235 times greater than a brightness level of the conventional substrate that has the similarly shaped footprint and/or base surface area. Alternatively, the VACNT substrate 510 in the fluorophore-exposed state can yield the brightness level that is greater or less than an increase of approximately 235 times greater than the conventional substrate that has the similarly shaped footprint and/or base surface area. Further, as another non-exclusive example, fluorescence on top of the VACNT array 514 in the fluorophore-exposed state can have a brightness intensity that is 448 times greater than a brightness level of the conventional substrate. Alternatively, the VACNT array 514 in the fluorophore-exposed state can yield the brightness intensity that is greater or less than an increase of 448. In various embodiments, a phonon-polaron coupling with the organic (fluorophore) layer is relatively long range, e.g. approximately greater than 3-4 nm. Because of the greater saturation of fluorophores using the system and methods provided herein, the relatively long range coupling can still produce significant and/or greatly improved fluorescence amplification.

Furthermore, in various embodiments, fluorescence intensity can be proportional to the nanotube height 18 (illustrated in FIG. 1) within the VACNT array 514 in the fluorophore-exposed state. As non-exclusive examples, the average nanotube height 18 of 2.8±0.5 nm has the fluorescence intensity greater than the nanotube heights 18 of 2.2 nm or 1.6 nm.

Figure 6:
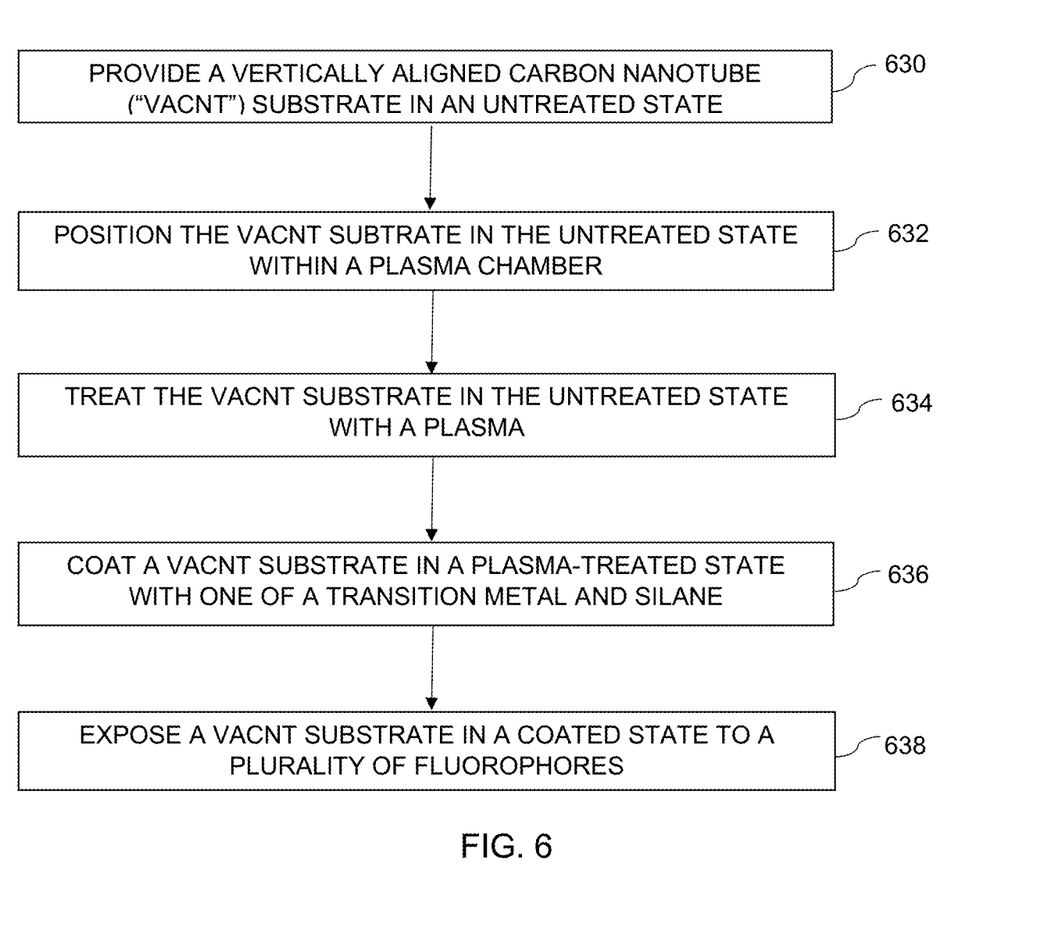
FIG. 6 is a flowchart that describes one embodiment of a method for manufacturing the vertically aligned carbon nanotube substrate.

FIG. 6 is a flowchart that describes one embodiment of a method for manufacturing the VACNT substrate. It is understood that the various steps described herein can be modified as necessary in the process of manufacturing the VACNT substrate. Additionally, it should also be appreciated that in certain applications the order of the steps can be modified, certain steps can be omitted, and/or additional steps can be added without limiting the intended scope and breadth of the present invention.

At step 630, the VACNT substrate in the untreated state is provided. One or more different VACNT substrates in the untreated state can be selected. In various embodiments, the VACNT substrate in the untreated state can include the VACNT array in the untreated state and the base. Each VACNT array in the untreated state can also include nanotubes in the untreated state. The VACNT array, including the nanotubes that make up the untreated VACNT array, is generally tangled, not consistently aligned, relatively disorganized and/or somewhat clustered while in the untreated state.

At step 632, the VACNT substrate in the untreated state can be positioned within the plasma chamber. In various embodiments, the VACNT substrate in the untreated state can be treated with and/or exposed to the plasma in the plasma chamber. Alternatively, the VACNT substrate in the untreated state can be treated with or exposed to the plasma in any other suitable manner. In one non-exclusive embodiment, the plasma chamber can include an induction coil that surrounds the plasma chamber which inductively-couples into a gas and transforms it into the plasma. In alternative embodiments, the design of the plasma chamber can be varied. In other embodiments, the plasma chamber can include a relatively low-temperature and/or a relatively low-pressure. Alternatively, the plasma chamber can use any parameters known to those skilled in the art that can transform the gas into the plasma.

At step 634, the VACNT substrate in the untreated state can be treated with or exposed to the plasma. Once the VACNT substrate in the untreated state is positioned within the plasma chamber, in certain non-exclusive embodiments, the plasma is formed within the plasma chamber using a gas flow rate, a power and/or a pressure low enough to allow the plasma to form. Alternatively, any other parameters known to those skilled in the art can be used with the plasma chamber to transform the gas into the plasma. As one non-exclusive example, an ammonia ("NH$_3$") gas, can be used. In such embodiment, the plasma chamber can transform the ammonia gas into an ammonia plasma. In alternative embodiments, any small-molecule, non-oxidizing gas, or any other gas known to those skilled in the art can be used. Still alternatively, NH$_2$R, NHR$_2$ and NR$_3$, where R is any non-oxidizing oligo, organic, or metal substituted chain can be used.

In certain embodiments, the gas flow rate can be varied to suit a specific composition of the gas. For example, in some embodiments, the gas flow rate can be greater than approximately 2 standard cubic centimeters per minute ("sccm") and less than approximately 15 sccm. More particularly, in various alternative embodiments, the gas flow rate can be at least approximately 2 sccm, 3 sccm, 4 sccm, 5 sccm, 6 sccm, 7 sccm, 8 sccm, 9 sccm, 10 sccm, 11 sccm, 12 sccm, 13 sccm, 14 sccm or 15 sccm. Alternatively, the gas flow rate can be greater than 15 sccm or less than 2 sccm.

Additionally, in certain embodiments, the power can be varied to suit the specific composition of the gas. For example, in some embodiments, the power can be greater than approximately 5 watts ("W") and less than approximately 75 W. More particularly, in various alternative embodiments, the power can be at least approximately 5 W, 10 W, 15 W, 20 W, 25 W, 30 W, 35 W, 40 W, 45 W, 50 W, 55 W, 60 W, 65 W, 70 W or 75 W. Alternatively, the power can be greater than 75 W or less than 5 W.

Furthermore, in other embodiments, the pressure can also be varied. For example, in some embodiments, the pressure can be greater than approximately 10 millitorr ("mTorr") and less than approximately 100 mTorr. More particularly, in various alternative embodiments, the pressure can be at least approximately 10 mTorr, 20 mTorr, 30 mTorr, 40 mTorr, 50 mTorr, 60 mTorr, 70 mTorr, 80 mTorr, 90 mTorr and 100 mTorr. Alternatively, the pressure can be greater than 100 mTorr or less than 10 mTorr.

In various embodiments, one or more of the following advantages are realized due to the plasma treatment: the VACNT array in the plasma-treated state gains hydrophilicity, e.g., becomes more water-accessible. As one non-exclusive example, exposure of the VACNT substrate in the untreated state to the ammonia plasma allows a relative increase in hydrophilicity over that which has been observed using oxidation. In addition, in other certain embodiments, the VACNT array in the plasma-treated state may become substantially more organized vertically, and relatively less tangled and/or less clustered.

At step 636, after treatment or exposure with the plasma, in various embodiments, the coating can be adhered to a portion of the VACNT substrate in the plasma-treated state. In other embodiments, the coating can be adhered to a portion of the VACNT substrate in the untreated state. The coating can include any suitable metallic or metal material. In some embodiments, the metallic, metal alloy or other metal material can include any suitable transition metal. In one non-exclusive embodiment, the metallic or metal material may include gold ("Au"). In other embodiments, the coating can include any rare earth combination known to those skilled in the art. In alternative embodiments, the coating can include silane. In yet other alternative embodiments, silica can be used.

In various embodiments, the coating can extend from the nanotube tips and down the nanotubes, i.e., into the VACNT array. In one non-exclusive embodiment, the coating can extend down the nanotubes in the coated state approximately 2 micrometers. In alternative embodiments, the coating can extend down the nanotubes in the coated state greater than approximately 2 micrometers and/or less than approximately 2 micrometers. Further, in one non-exclusive embodiment, the coating can adhere to greater than approximately 5% and less than 100% of individual nanotubes in the VACNT array in the coated state. More particularly, in various alternative embodiments, the coating can adhere to at least approximately 5%, 10%, 20%, 30%, 40%, 50%, 60%, 70%, 80%, 90%, 95% or 99% of individual nanotubes in the VACNT array in the coated state. Alternatively, the coating can adhere to less than 5% or any other suitable percentage of individual nanotubes in the VACNT array in the coated state.

In various embodiments, the coating can include quartz crystal microbalance ("QCM") thickness of greater than approximately 100 nm and less than approximately 300 nm. More particularly, in various alternative embodiments, the QCM thickness can be at least approximately 100 nm, 150 nm, 200 nm, 250 nm, or 300 nm. Alternatively, the QCM thickness can be greater than 300 nm or less than 100 nm.

In certain embodiments, the coating may be adhered to a portion of the VACNT array in the plasma-treated state using the process of thermal evaporation or e-beam ablation. Additionally and/or alternatively, the coating may be adhered to a portion of the VACNT array in the plasma-treated state via any other suitable method or process known to those skilled in the art.

At step 638, in various embodiments, to achieve fluorescence, the plurality of fluorophores can be adhered to a portion of the VACNT substrate in the coated state, e.g., the fluorophores can be adsorbed onto the coating. In alternative embodiments, the plurality of fluorophores may be adhered to the VACNT substrate in one of the untreated state or plasma-treated state. In certain embodiments, any fluorophore may be used to achieve fluorescence. In other embodiments, any molecule known to those skilled in the art may be used to achieve fluorescence. Further, any suitable method or process for adhering the fluorophore to at least a portion of the VACNT substrate in the coated state can be used.

Figure 7:
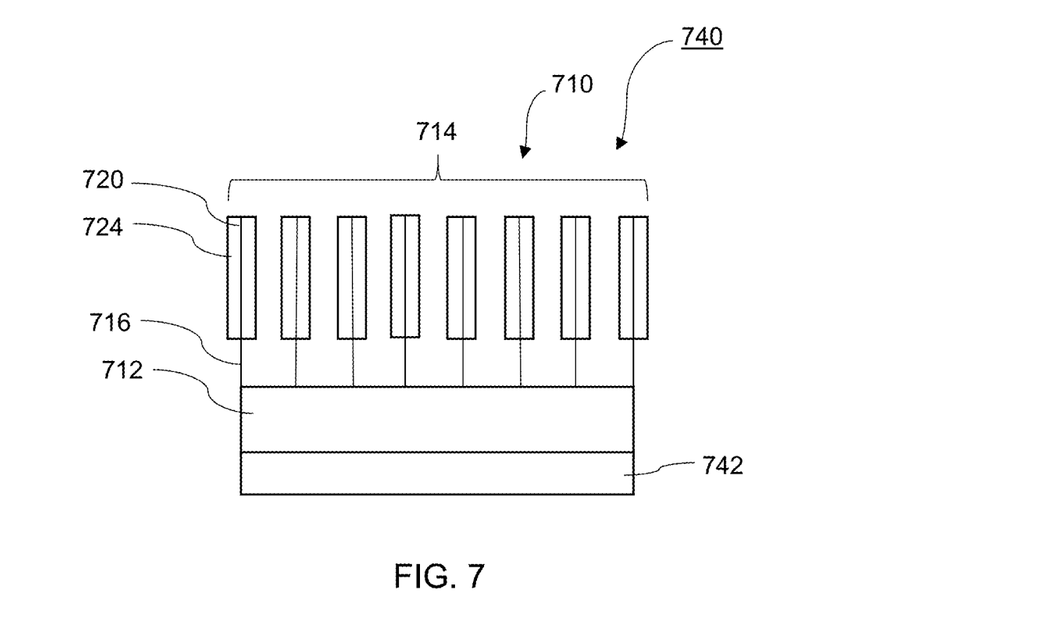
FIG. 7 is a simplified side view illustration of a portion of an embodiment of a broadband fluorescence amplification assembly.

FIG. 7 is a simplified side view illustration of a portion of an embodiment of a broadband fluorescence amplification assembly 740. The design of the broadband amplification assembly 740 can vary. In the embodiment illustrated in FIG. 7, the broadband fluorescence amplification assembly 740 can include a VACNT substrate 710 and a support structure 742. It is understood that the broadband fluorescence amplification assembly 740 can include additional components than those specifically illustrated and described herein.

In the embodiment illustrated in FIG. 7, the broadband fluorescence amplification assembly 740 includes the VACNT substrate 710 in the coated state. As referred to herein, the coated state means that the VACNT substrate 710 has been treated with the plasma 322 (illustrated in FIG. 3A) and at least partially coated with the coating 724. In various embodiments, the coating 724 can include any metal material and/or metal alloys. In some embodiments, the metal material can include any suitable transition metal. In the embodiment illustrated in FIG. 7, only a portion of the VACNT substrate 710 in the coated state is illustrated. In various embodiments, the VACNT substrate 710 in the coated state can include a base 712 and a VACNT array 714 in the coated state that is supported by the base 712. Each VACNT array 714 in the coated state can also include a plurality of nanotubes 716 in the coated state. In certain embodiments, the plurality of nanotubes 716 in the coated state have been at least partially coated with the coating 724. Each nanotube 716 in the coated state also includes a corresponding nanotube tip 720 in the coated state. In this embodiment the nanotubes 716, including the nanotube tips 720, have been at least partially, if not fully, coated with the coating 724. Alternatively, the VACNT substrate 710 can include the VACNT substrate 310 (illustrated in FIG. 3A, for example) in the plasma-treated state or the VACNT substrate 210 (illustrated in FIG. 2A, for example) in the untreated state.

In various embodiments, the support structure 742 supports the VACNT substrate 710. In other words, the VACNT substrate 710 can be positioned on at least a portion of the support structure 742. The design, shape and thickness of the support structure 742 can vary. In certain alternate embodiments, the support structure 742 can include a microscope slide, an ELISA well plate or an electrophoresis gel, as non-exclusive examples. For example, in the embodiment illustrated in FIG. 7, the support structure 742 includes a portion of the microscope slide. Still alternatively, the support structure 742 can include structures that are formed from other materials than those previously described.

In certain embodiments, the support structure 742 can be formed at least partially from quartz and/or glass. In other non-exclusive alternative embodiments, the support structure 742 can be formed from a crystalline material, a ceramic material, a plastic, or a gel. Still alternatively, the support structure 742 can be composed of any other suitable material known to those skilled in the art.

Figure 8:
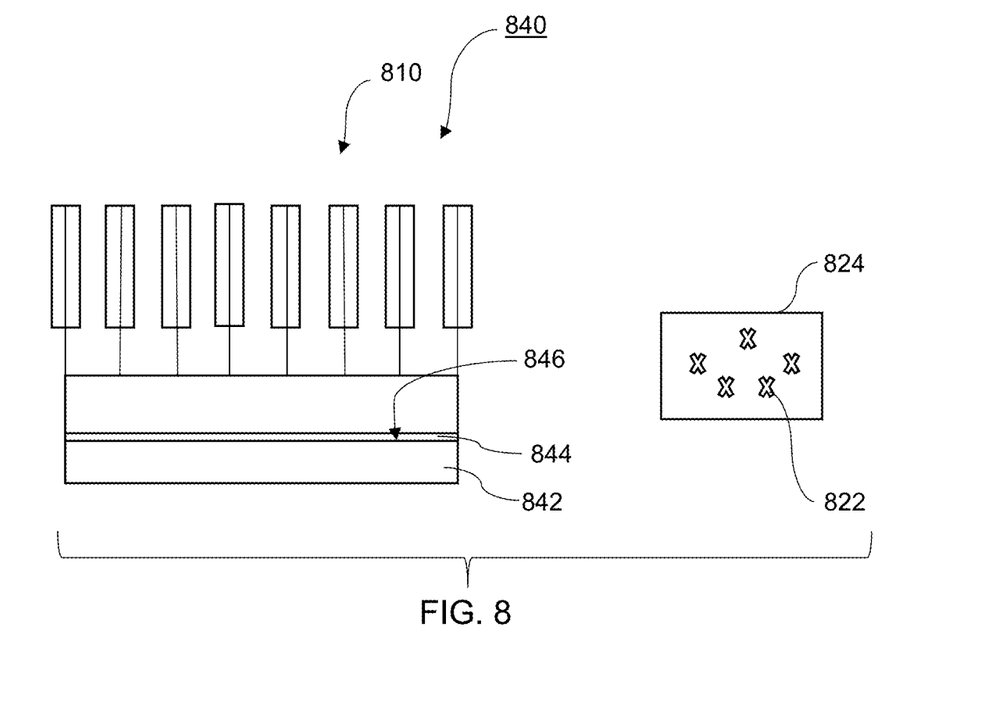
FIG. 8 is a simplified side view illustration of the plasma, the plasma chamber and a portion of another embodiment of the broadband fluorescence amplification assembly.

FIG. 8 is a simplified side view illustration of a portion of the plasma 822, the plasma chamber 824 and another embodiment of the broadband fluorescence amplification assembly 840. In the embodiment illustrated in FIG. 8, the broadband fluorescence amplification assembly 840 can include an adhesive material 844. The adhesive material 844 adheres the VACNT substrate 810 to the support structure 842. The specific type of adhesive material 844 can vary. In certain embodiments, the adhesive material 844 can include a cyanoacrylate adhesive, as one non-exclusive example. Cyanoacrylate adhesives are strong fast-acting adhesives which can include methyl 2-cyanoacrylate, ethyl-2-cyanoacrylate, n-butyl cyanoacrylate and/or 2-octyl cyanoacrylate. In another embodiment, the adhesive material 844 can include a two component epoxy. The two component epoxy can consist of a resin and a hardener that offers the ability to cure at ambient temperatures or at elevated temperatures for faster cures. In alternative embodiments, the adhesive material 844 can include any other material(s) known to those skilled in the art that can adequately adhere the VACNT substrate 810 to the support structure 842. Additionally and/or alternatively, the VACNT substrate 810 can be adhered to the support structure 842 via any other suitable method or process.

The broadband fluorescence amplification assembly 840, i.e., the VACNT substrate 810 in the coated state, the adhesive material 844 and the support structure 842, is treated with and/or exposed to the plasma 822. In accordance with the methods disclosed herein, in certain embodiments, at least a portion of the broadband fluorescence amplification assembly 840 has been treated with or exposed to the plasma 822 to substantially clean the support structure 842 and/or to adequately provide amine functionalization of the support structure 842. In one embodiment, the broadband fluorescence amplification assembly 840 can be positioned within the plasma chamber 824 wherein the broadband fluorescence amplification assembly 840 is treated with or exposed to the plasma 822. Alternatively, the broadband fluorescence amplification assembly 840 can be treated with or exposed to the plasma 822 in any suitable manner.

As illustrated in the embodiment in FIG. 8, the support structure 842 can have a substantially flat adhering surface 846. In FIG. 8, a portion of the VACNT substrate 810 in the coated state has been coupled to, e.g. adhered to, a portion of the substantially flat adhering surface 846 of the support structure 842 with the adhesive material 844. In alternative embodiments, the adhering surface 846 can include a relatively curved, angled and/or uneven adhering surface 846, as non-exclusive examples. Additionally and/or alternatively, the adhering surface 846 can include any design and/or form which allows the VACNT substrate 810 in the coated state to be adhered to the support structure 842.

Figure 9:
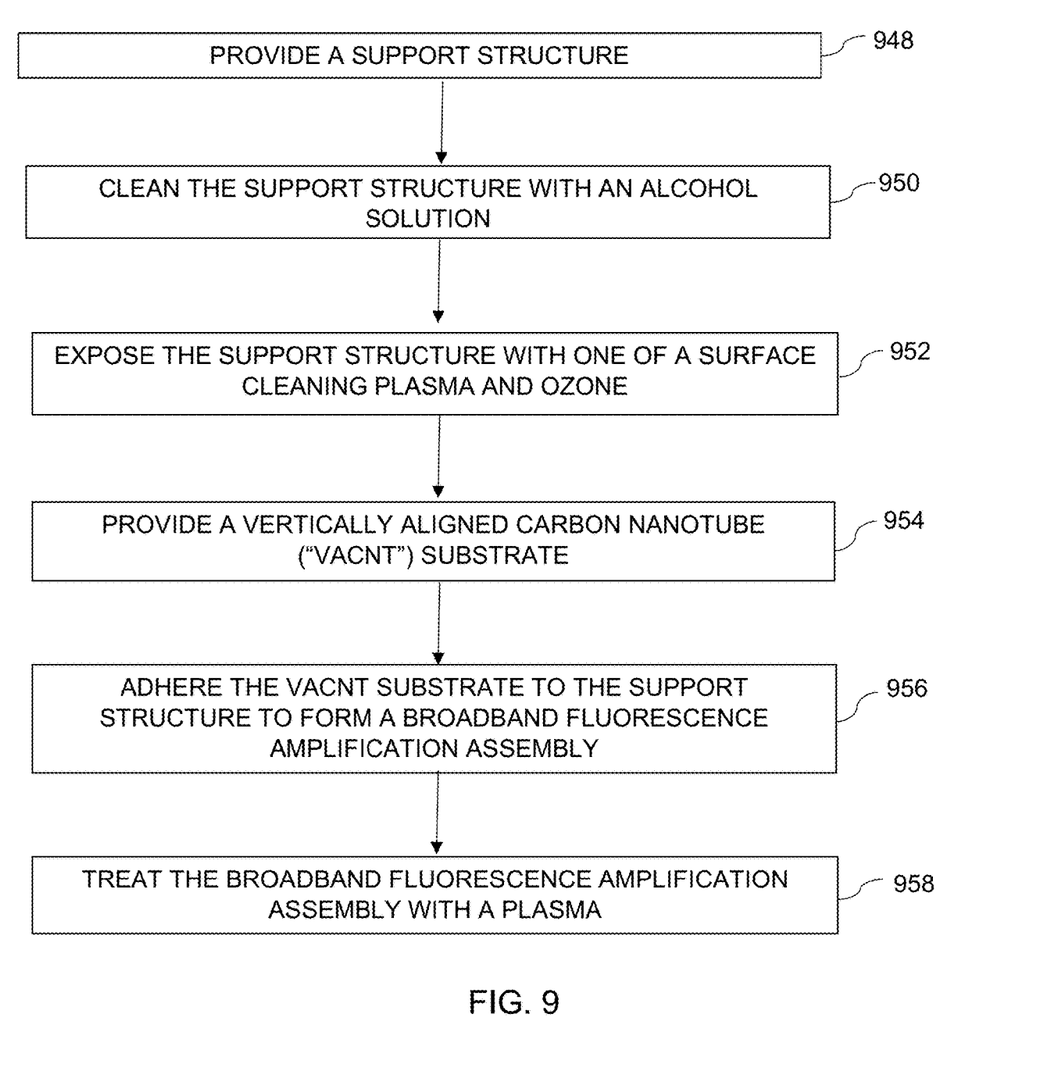
FIG. 9 is a flowchart that describes one embodiment of a method for manufacturing the broadband fluorescence amplification assembly.

FIG. 9 is a flowchart that describes one embodiment of a method for manufacturing the broadband fluorescence amplification assembly. It is understood that the various steps described herein can be modified as necessary in the process of manufacturing the broadband fluorescence amplification assembly. Additionally, it should also be appreciated that in certain applications the order of the steps can be modified, certain steps can be omitted, and/or additional steps can be added without limiting the intended scope and breadth of the present invention.

At step 948, the support structure is provided. One or more different support structures can be selected. The design, shape and thickness of each support structure can vary. As non-exclusive examples, the support structure can include the microscope slide, the ELISA well plate or the electrophoresis gel. Additionally, the support structure can include any other form of support structure known to those skilled in the art that can support the VACNT substrate.

At step 950, the support structure is cleaned and/or washed. The method of cleaning the support structure can vary. In certain embodiments, the support structure can be cleaned with an alcohol solution. In such embodiments, the alcohol solution can include an ethanol, e.g. absolute ethanol. In alternative embodiments, any form of cleaning agent known to those skilled in the art that adequately cleans and/or washes the support structure can be used. Additionally and/or alternatively, the support structure can be cleaned and/or washed via any suitable method or manner. Once the support structure has been cleaned and/or washed, the support structure can be allowed to dry.

At step 952, the support structure is exposed to one of the surface cleaning plasma or ozone. The surface cleaning plasma or ozone can function to substantially remove any remaining impurities and to relatively etch the surface of the support structure in preparation for applying the adhesive material. In various embodiments, the support structure can be exposed to the surface cleaning plasma or ozone via any suitable method or process. As certain non-exclusive alternate embodiments, the surface cleaning plasma can include $O_2$, $N_2$ and/or $NH_3$. Alternatively, the surface cleaning plasma can include other plasma compounds. Additionally and/or alternatively, the support structure can be exposed to any other substance or compound known to those skilled in the art that can substantially remove impurities and relatively etch the surface of the support structure.

At step 954, the VACNT substrate in the coated state is provided. One or more different VACNT substrates in the coated state can be selected. In various embodiments, the VACNT substrate in the coated state can include the VACNT array in the coated state and the base. Each VACNT array in the coated state can also include nanotubes in the coated state.

At step 956, the VACNT substrate in the coated state is adhered to the support structure to form the broadband fluorescence amplification assembly. In various embodiments, the VACNT substrate in the coated state is adhered to the support structure via the adhesive material. The adhesive material can vary. Further, the amount and/or thickness of the adhesive material applied can also vary. As one non-exclusive example, the adhesive material can include the cyanoacrylate adhesive. As another non-exclusive example, the adhesive material can include the two component epoxy. Alternatively, the adhesive material can include any material known to those skilled in the art that adequately adheres the VACNT substrate in the coated state to the support structure. Still alternatively, in certain embodiments, the VACNT substrate in the coated state can be adhered to the support structure by impregnating the electrophoresis gel. Additionally and/or alternatively, the VACNT substrate in the coated state can be adhered to the support structure via any suitable method or process known to those skilled in the art.

At step 958, the broadband fluorescence amplification assembly, i.e., the VACNT substrate in the coated state, the adhesive material and the support structure, is treated with and/or exposed to the plasma. In certain embodiments, the plasma treatment can function to substantially clean the support structure and/or to adequately provide amine functionalization of the support structure. As one non-exclusive example, the plasma can include $NH_3$ gas. In alternative embodiments, the plasma can include any small-molecule, non-oxidizing gas, or any other gas known to those skilled in the art. Still alternatively, the plasma can include $NH_2R$, $NHR_2$ and $NR_3$, where R is any non-oxidizing oligo, organic, or metal substituted chain. In various embodiments, the broadband fluorescence amplification assembly can be treated with or exposed to the plasma in the plasma chamber. In other embodiments, the broadband fluorescence amplification assembly can be treated with or exposed to the plasma via any suitable method.

It is understood that although a number of different embodiments of the broadband fluorescence amplification assembly 740, 840 and methods of manufacture of the broadband fluorescence amplification assembly 740, 840 have been described herein, one or more features of any one embodiment can be combined with one or more features of one or more of the other embodiment, provided that such combination satisfies the intent of the present invention.

While a number of exemplary aspects and embodiments of the broadband fluorescence amplification assembly 740, 840 and methods of manufacture of broadband fluorescence amplification assembly 740, 840 have been shown and disclosed herein above, those of skill in the art will recognize certain modifications, permutations, additions and sub-combinations thereof. It is therefore intended that the system and method shall be interpreted to include all such modifications, permutations, additions and sub-combinations as are within their true spirit and scope, and no limitations are intended to the details of construction or design herein shown.

What is claimed is:

1. A broadband fluorescence amplification assembly comprising:
   a base;
   a vertically aligned carbon nanotube array that is grown on the base and treated with a plasma so that the vertically aligned carbon nanotube array becomes at least one of substantially straightened vertically and hydrophilic;
   a support structure that supports the base and the plasma treated vertically aligned carbon nanotube array;
   a metal coating that only partially coats the plasma treated vertically aligned carbon nanotube array so that the plasma treated vertically aligned carbon nanotube array is in a coated state; and
   a plurality of fluorophores that are adhered to the plasma treated vertically aligned carbon nanotube array while the plasma treated vertically aligned carbon nanotube array is in the coated state.

2. The broadband fluorescence amplification assembly of claim 1 wherein the support structure includes one of quartz and glass.

3. The broadband fluorescence amplification assembly of claim 1 wherein the support structure has been cleaned with an alcohol solution.

4. The broadband fluorescence amplification assembly of claim 3 wherein the alcohol solution includes an ethanol.

5. The broadband fluorescence amplification assembly of claim 1 wherein the support structure has been exposed to one of a surface cleaning plasma and ozone.

6. The broadband fluorescence amplification assembly of claim 1 further comprising an adhesive material that is applied to at least a portion of the support structure, the adhesive material adhering the vertically aligned carbon nanotube array to the support structure.

7. The broadband fluorescence amplification assembly of claim 6 wherein the adhesive material includes one of a cyanoacrylate adhesive.

8. The broadband fluorescence amplification assembly of claim 6 wherein the adhesive material includes a two component epoxy.

9. The broadband fluorescence amplification assembly of claim 6 wherein the support structure is treated with the plasma.

10. A broadband fluorescence amplification assembly comprising:
    a base;
    a vertically aligned carbon nanotube array that is grown on the base and treated with a plasma so that the vertically aligned carbon nanotube array becomes at least one of substantially straightened vertically and hydrophilic;
    a support structure that supports the base and the plasma treated vertically aligned carbon nanotube array;
    a metal coating that only partially coats the plasma treated vertically aligned carbon nanotube array so that the plasma treated vertically aligned carbon nanotube array is in a coated state; and
    a plurality of fluorophores that are adhered to the plasma treated vertically aligned carbon nanotube array while the plasma treated vertically aligned carbon nanotube array is in the coated state;
    wherein the broadband fluorescence amplification assembly is configured to collimate a fluorescence intensity from the plurality of fluorophores.

11. The broadband fluorescence amplification assembly of claim 10 wherein the support structure includes one of quartz and glass.

12. The broadband fluorescence amplification assembly of claim 10 wherein the support structure has been cleaned with an alcohol solution.

13. The broadband fluorescence amplification assembly of claim 12 wherein the alcohol solution includes an ethanol.

14. The broadband fluorescence amplification assembly of claim 10 wherein the support structure has been exposed to one of a surface cleaning plasma and ozone.

15. The broadband fluorescence amplification assembly of claim 10 wherein the vertically aligned carbon nanotube array and the support structure are treated with the plasma.

16. The broadband fluorescence amplification assembly of claim 10, further comprising nanotube tips that have been only partially coated.

17. The broadband fluorescence amplification assembly of claim 10, wherein the support structure is an ELISA well plate.

18. The broadband fluorescence amplification assembly of claim 10, wherein the base has a top and a bottom, and at least a portion of the bottom is configured to adhere to at least a portion of the support structure.

19. The broadband fluorescence amplification assembly of claim 10 wherein the support structure includes an adhering surface that is one of curved, angled, and uneven.

20. A broadband fluorescence amplification assembly comprising:
    a base;
    a vertically aligned carbon nanotube array that is grown on the base and treated with a plasma so that the vertically aligned carbon nanotube array becomes at least one of substantially straightened vertically and hydrophilic, the vertically aligned carbon nanotube array having a plurality of nanotube tips;
    a support structure that supports the base and the plasma treated vertically aligned carbon nanotube array;
    a metal coating that only partially coats the plasma treated vertically aligned carbon nanotube array and the plurality of nanotube tips so that the plasma treated vertically aligned carbon nanotube array and the plurality of nanotube tips are in a coated state; and
    a plurality of fluorophores that are adhered to the plasma treated vertically aligned carbon nanotube array while the plasma treated vertically aligned carbon nanotube array is in the coated state;
    wherein the broadband fluorescence amplification assembly is configured to collimate a fluorescence intensity from the plurality of fluorophores, the fluorescence intensity being proportional to a height of the vertically aligned carbon nanotube array.

\* \* \* \* \*